US009160088B2

United States Patent
Rossman et al.

(10) Patent No.: US 9,160,088 B2
(45) Date of Patent: Oct. 13, 2015

(54) BACKPLANE COMMUNICATION SYSTEM AND RACK ASSEMBLY OF THE SAME

(71) Applicant: Tyco Electronics Corporation, Berwyn, PA (US)

(72) Inventors: Jared Evan Rossman, Dover, PA (US); Christopher Ritter, Hummelstown, PA (US); Robert Paul Nichols, Vacaville, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 99 days.

(21) Appl. No.: 14/156,020

(22) Filed: Jan. 15, 2014

(65) Prior Publication Data

US 2015/0200474 A1    Jul. 16, 2015

(51) Int. Cl.
*H01R 12/00* (2006.01)
*H01R 12/70* (2011.01)
*H01R 12/91* (2011.01)

(52) U.S. Cl.
CPC ............ *H01R 12/7005* (2013.01); *H01R 12/91* (2013.01)

(58) Field of Classification Search
USPC ..................................... 439/64, 378; 361/788

IPC ........ H01R 23/7005,23/7068, 23/7073, 13/629, H01R 13/6315
See application file for complete search history.

(56) References Cited

U.S. PATENT DOCUMENTS

| | | | | |
|---|---|---|---|---|
| 6,535,397 | B2 * | 3/2003 | Clark et al. | 361/788 |
| 7,095,622 | B2 * | 8/2006 | Barsun et al. | 361/788 |
| 8,238,117 | B2 * | 8/2012 | Burwell et al. | 361/796 |
| 8,721,348 | B2 * | 5/2014 | Costello | 439/64 |

* cited by examiner

*Primary Examiner* — Hien Vu (57) ABSTRACT

Backplane communication system including a backplane and a rack assembly having an array of electrical connectors with respective mating ends. The backplane communication system also includes a plurality of guide pins that each have a cross-sectional diameter taken transverse to an axis of the guide pin. The backplane interfaces with the rack assembly such that the guide pins extend through guide holes of the backplane and the electrical connectors are aligned with mating windows. Each of the guide pins has a leading segment that extends through the corresponding guide hole and a trailing segment that is disposed within the corresponding guide hole. The cross-sectional diameter along the trailing segment is greater than the cross-sectional diameter along the leading segment.

20 Claims, 8 Drawing Sheets

BACKPLANE COMMUNICATION SYSTEM AND RACK ASSEMBLY OF THE SAME

BACKGROUND

The subject matter herein relates generally to a backplane communication system having a rack assembly with an array of electrical connectors and a backplane having windows that align with the electrical connectors.

Backplane or midplane communication systems, such as those used with network systems, servers, data centers, and the like, include large circuit boards that are known as backplanes or midplanes. The terms "backplane" and "midplane" may be used interchangeably with respect to the subject matter described herein. The backplanes may be used to interconnect communication devices, such as daughter card assemblies. The daughter card assemblies include line card assemblies and switch card assemblies. In such communication systems, an array of high-speed differential electrical connectors mounted to the backplane mate with electrical connectors of the daughter card assemblies to transmit data signals through the backplane communication system.

In a conventional backplane communication system, the backplane is a large circuit board having conductive traces that interconnect the electrical connectors of the backplane. More recently, the conventional backplane communication systems have been replaced by cable backplane systems. In a cable backplane system, cable connectors are mechanically mounted to a large circuit board or similar structure, such as sheet metal, to form a rack assembly. Instead of traces, the cable connectors are communicatively coupled to one another through communication cables. The cable connectors may function in a similar manner as the electrical connectors of the conventional backplane communication system and interconnect the daughter card assemblies.

There has been a general market demand to increase the throughput of such communication systems, which has led to an increase in the overall size of the communication systems, the number of electrical connectors used, and/or the density of electrical connectors used. Such changes, however, often create new challenges. For example, during the assembly of a cable backplane system, the backplane may be positioned alongside the rack assembly such that the electrical connectors extend through windows of the backplane. However, due to the size of the backplane and/or the number of electrical connectors, misalignment may occur between the electrical connectors and the backplane as the rack assembly approaches the backplane or vice versa. If excessive force is used to couple the backplane and the rack assembly when the electrical connectors are misaligned, the backplane and/or the electrical connectors may be damaged.

Accordingly, a need remains for a backplane communication system that reduces the risk of damaging the electrical connectors and/or backplane during assembly of the backplane communication system.

BRIEF DESCRIPTION

In an embodiment, a backplane communication system is provided that includes a backplane having mating windows and guide holes that extend through the backplane. The backplane communication system also includes a rack assembly having an engagement side and an array of electrical connectors with respective mating ends that are disposed along and face away from the engagement side. The backplane communication system also has a plurality of guide pins. Each of the guide pins has a distal end, a proximal end, and a central axis extending therebetween. Each of the guide pins has a cross-sectional diameter taken transverse to the corresponding central axis. The guide pins are coupled to the rack assembly at the proximal ends and project away from the engagement side. The backplane interfaces with the engagement side such that the guide pins extend through corresponding guide holes and the electrical connectors are aligned with the mating windows. Each of the guide pins has a leading segment that extends through the corresponding guide hole and a trailing segment that is disposed within the corresponding guide hole. The cross-sectional diameter along the trailing segment is greater than the cross-sectional diameter along the leading segment.

In some aspects, each of the guide pins may include a stepped portion that is located between the leading and trailing segments. The cross-sectional diameter along the stepped portion may increase as the guide pin extends from the leading segment to the trailing segment. More specifically, the stepped portion may be located a first axial distance away from the backplane and the electrical connectors may clear the backplane such that distal edges of the electrical connectors are located a second axial distance away from the backplane. The second axial distance is less than the first axial distance.

In some aspects, the rack assembly may include a brick unit having a sub-array of the electrical connectors and a unit housing that supports the sub-array of the electrical connectors. At least one of the guide pins may have a fixed position with respect to the unit housing. In more particular aspects, the rack assembly may include an assembly frame that floatably holds a plurality of the brick units such that each of the brick units is capable of independently moving relative to the assembly frame. The brick unit may be configured to move relative to the assembly frame as the at least one guide pin engages a daughter card assembly in a misaligned manner. The electrical connectors of the sub-array may be floatably held by the unit housing. Each of the electrical connectors of the sub-array may be configured to mate with a corresponding connector of the daughter card assembly, wherein each of the electrical connectors of the sub-array is configured to independently move relative to the unit housing as the corresponding connector engages the respective electrical connector in a misaligned manner.

In some aspects, the rack assembly may include first and second brick units that each have a sub-array of the electrical connectors. The electrical connectors of the first brick unit may have an orthogonal relationship with respect to the electrical connectors of the second brick unit.

In another embodiment, a rack assembly of a backplane communication system is provided. The rack assembly includes an assembly frame having an engagement side configured to interface with a backplane. The rack assembly also includes a plurality of brick units that are supported by the assembly frame. Each of the brick units includes electrical connectors having mating ends for engaging corresponding connectors of a daughter card assembly. The mating ends are disposed along the engagement side. The rack assembly also includes a plurality of guide pins that each have a distal end, a proximal end, and a central axis extending therebetween. Each of the guide pins also has a cross-sectional diameter taken transverse to the corresponding central axis. The guide pins are coupled to the assembly frame and project away from the engagement side. Each of the guide pins has a leading segment that is configured to be inserted through a guide hole of the backplane and a trailing segment that is configured to be located within the guide hole when the backplane interfaces with the engagement side. The cross-sectional diameter along the trailing segment is greater than the cross-sectional diameter along the leading segment.

DETAILED DESCRIPTION

Embodiments set forth herein may include backplane communication systems and rack assemblies or other sub-systems of the same, such as brick units. The backplane communication systems include one or more backplanes or midplanes and one or more of the rack assemblies. As used herein, the terms "backplane" and "midplane" may be used interchangeably and include walls constructed from circuit board material, such as FR-4, or walls constructed from other materials, such as sheet metal. For simplicity, the term backplane is used hereafter. The backplane has one or more openings that permit elements of the rack assembly to pass through the backplane. For example, the rack assembly has an array of electrical connectors that are configured to be aligned with corresponding mating window(s) of the backplane when the rack assembly and the backplane interface with each other. As used herein, an electrical connector may be aligned with a mating window when (a) the electrical connector extends through the mating window or (b) the electrical connector does not extend through the mating window but is positioned to engage with another connector that is inserted through the mating window. The rack assembly may also include guide pins that are inserted through guide holes when the rack assembly and the backplane interface with each other.

During assembly of the backplane communication system, the rack assembly and the backplane are moved relatively toward each other. More specifically, the rack assembly may be advanced toward the backplane, the backplane may be advanced toward the rack assembly, or both may be moved toward each other. During some assemblies, the backplane is mounted within a chassis such that the backplane is located a depth within the chassis. The rack assembly may then be loaded into the chassis. In certain embodiments, the rack assembly includes guide pins that project in the loading direction. As the rack assembly is loaded into the chassis, the guide pins may engage the backplane to align the rack assembly so that the electrical connectors align with the mating windows.

In an exemplary embodiment, the backplane communication system is a cable backplane system. However, it is understood that the various embodiments set forth herein may be implemented in other types of communication systems and devices. The backplane communication systems may be used in various applications. By way of example only, the backplane communication systems may be used in telecom and computer applications, routers, servers, supercomputers, and uninterruptible power supply (UPS) systems. One or more of the electrical connectors described herein may be similar to electrical connectors of the STRADA Whisper or Z-PACK TinMan product lines developed by TE Connectivity. For example, one or more of the electrical connectors may be capable of transmitting data signals at high speeds, such as 10 gigabits per second (Gb/s), 20 Gb/s, 30 Gb/s, or more. In more particular embodiments, one or more of the electrical connectors may be capable of transmitting data signals at 40 Gb/s, 50 Gb/s, or more. The electrical connectors may include high-density, two-dimensional arrays of signal contacts. A high-density array may have, for example, at least 12 signal contacts per 100 mm$^2$ along a mating face of the electrical connector. In more particular embodiments, the high-density array may have at least 20 signal contacts per 100 mm$^2$ along a mating face of the electrical connector.

Figure 1:
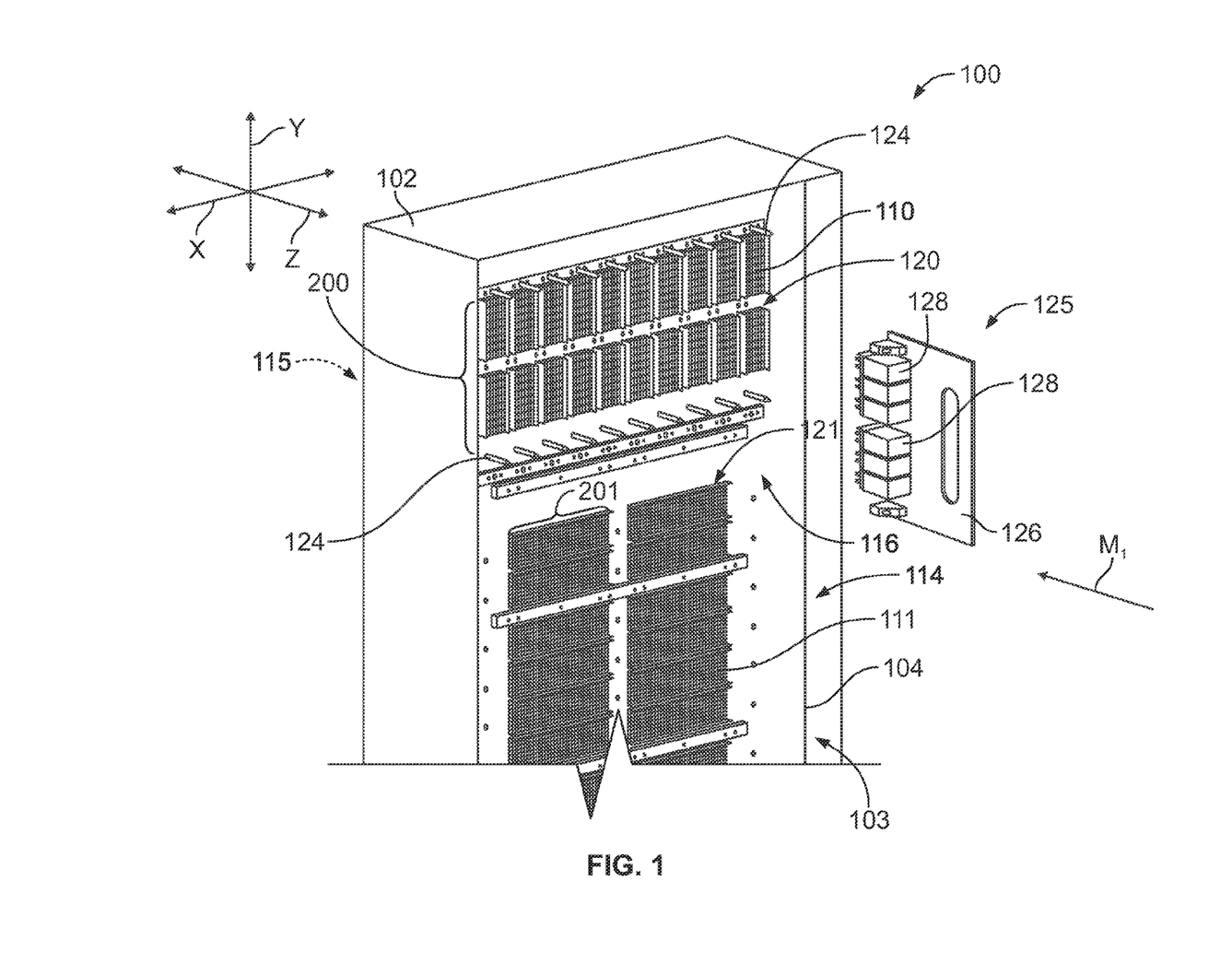
FIG. 1 is a front-perspective view of a backplane communication system formed in accordance with an embodiment.

FIG. 1 is a front perspective view of a portion of a backplane communication system 100 formed in accordance with an embodiment. For reference, the backplane communication system 100 is oriented with respect to mutually perpendicular X-, Y-, and Z-axes in FIG. 1. The backplane communication system 100 may include a chassis 102, one or more backplanes 104 coupled to and supported by the chassis 102, and one or more rack assemblies 106 (shown in FIG. 2). The rack assembly 106 includes electrical connectors 110, 111. In particular embodiments, the electrical connectors 110, 111 are part of respective brick units 200, 201. As shown, the electrical connectors 110 of the brick units 200 are positioned side-by-side along the Y-axis, and the electrical connectors 111 of the brick units 201 are positioned side-by-side along the X-axis. In some embodiments, the electrical connectors 110 of the brick units 200 may have an orthogonal relationship with respect to the electrical connectors 111 of the brick units 201. For instance, the electrical connectors 110, 111 may have identical configurations, but the electrical connectors 111 may be rotated +/−90° with respect to the electrical connectors 110 as described below.

Figure 3:
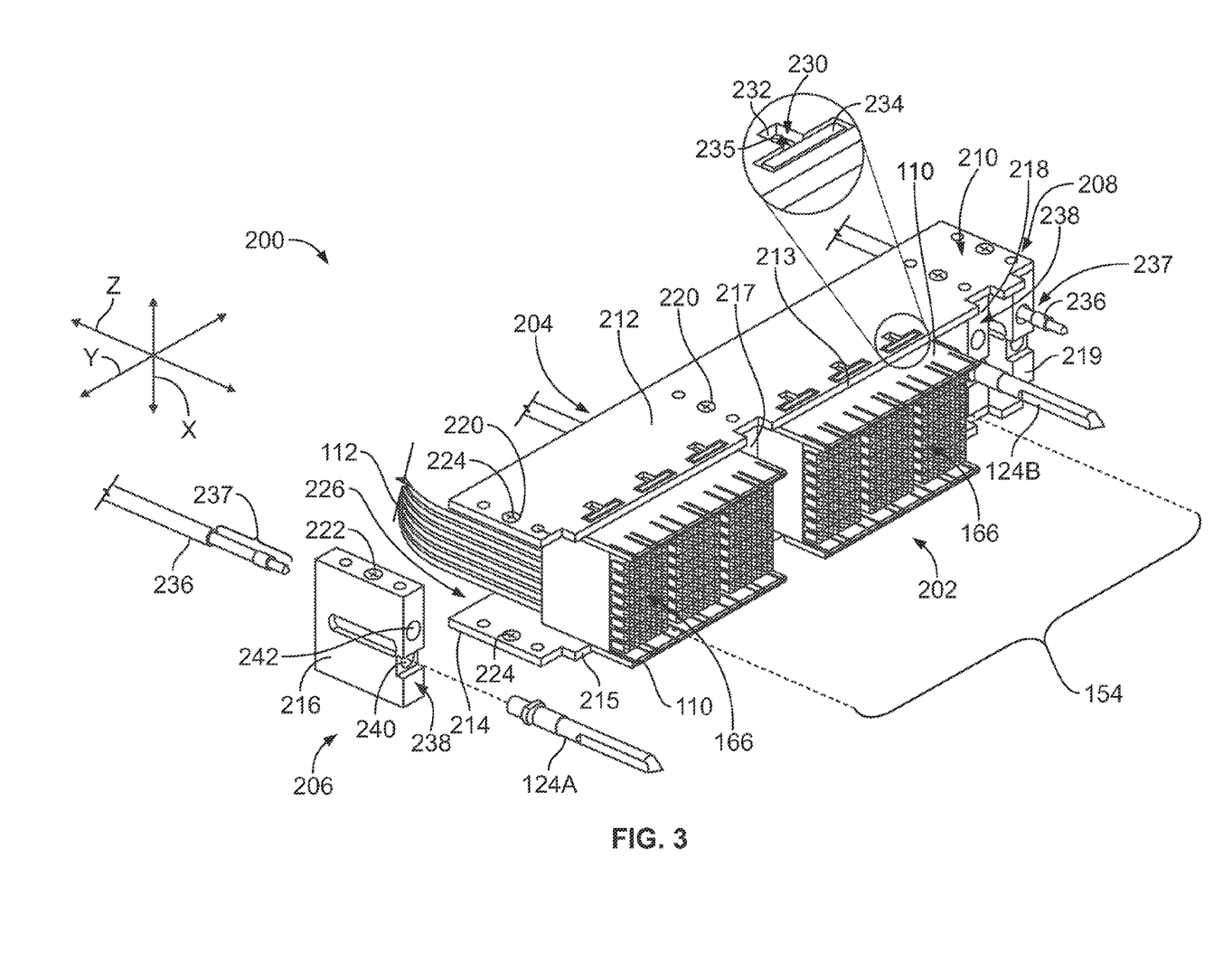
FIG. 3 is a partially exploded view of a brick unit formed in accordance with an embodiment that may be used with the backplane communication system of FIG. 1.

The electrical connectors 110, 111 may be cable connectors that are interconnected to one another through communication cables 112 (shown in FIG. 3). More specifically, one or more of the electrical connectors 110 may be interconnected to one or more of the electrical connectors 111 through the communication cables 112. In such embodiments, the electrical connectors 110, 111 and the communication cables 112 eliminate interconnections via traces of a circuit board, such as those that may be used in more conventional backplane communication systems. The electrical connectors 110, 111 and the communication cables 112 may have improved signal performance along the signal paths between various connectors of the backplane communication system 100 as compared to conventional backplane communication systems. However, in alternative embodiments, the backplane communication system 100 may include features similar to more conventional backplane systems that interconnect the electrical connectors through traces within the backplane.

The backplane 104 may be a circuit board and may be manufactured from circuit board material known in the art, such as FR-4 material. In other embodiments, the backplane 104 may be formed from another suitable structure, such as sheet metal. The backplane 104 is configured to be disposed within a chassis cavity 103 defined by the chassis 102. The chassis cavity 103 is accessible through a front or first opening 114 of the backplane communication system 100 and an opposite back or second opening 115. During assembly of the backplane communication system 100, the backplane 104 and/or the rack assembly 106 may be loaded into the chassis cavity 103 through the front opening 114 or through the back opening 115. In addition to the rack assembly 106, the chassis 102 may support other components (not shown) of the backplane communication system 100, such as power supplies, cooling fans, and the like.

The backplane 104 has a first or front side 116 and an opposite second or back side 118 (shown in FIG. 2) and includes mating windows 120, 121 that extend through the backplane 104 between the first and second sides 116, 118. When the rack assembly 106 interfaces with the backplane 104 along the second side 118, the mating windows 120, 121 permit the electrical connectors 110, 111, respectively, to extend through the mating windows 120, 121 to be presented along the first side 116 for engaging one or more daughter card assemblies 125. To this end, each of the rack assemblies 106 may include a plurality of guide pins 124 that are configured to engage and align the backplane 104 relative to the rack assemblies 106. The guide pins 124 may also engage the daughter card assemblies 125 when the daughter card assemblies 125 are mated with the electrical connectors 110.

Depending on the configuration and purpose of the daughter card assemblies 125, the daughter card assemblies 125 may be referred to as line card assemblies or switch card assemblies. As shown in FIG. 1, the daughter card assembly 125 includes a circuit board 126 (or daughter card) and electrical connectors 128 positioned along a leading edge of the circuit board 126. In certain embodiments, the electrical connectors 110, 111, and 128 are high-speed differential connectors, such as the STRADA Whisper or Z-PACK TinMan electrical connectors developed by TE Connectivity.

The daughter card assemblies 125 are configured to be advanced toward the backplane 104 in a mating direction $M_1$ along the Z-axis. The backplane 104 is coupled to the chassis 102 and held in a position such that the backplane 104 coincides with a plane defined by the X- and Y-axes. In the illustrated embodiment, the Y-axis extends parallel to the force of gravity. However, it is understood that other embodiments may have different orientations with respect to gravity. As used herein, the term "lateral" may be used to describe movement along the X-axis and/or Y-axis or may be used to describe placement of an element along the X-axis and/or Y-axis. As such, the X- and Y-axes may be referred to as lateral axes.

Figure 2:
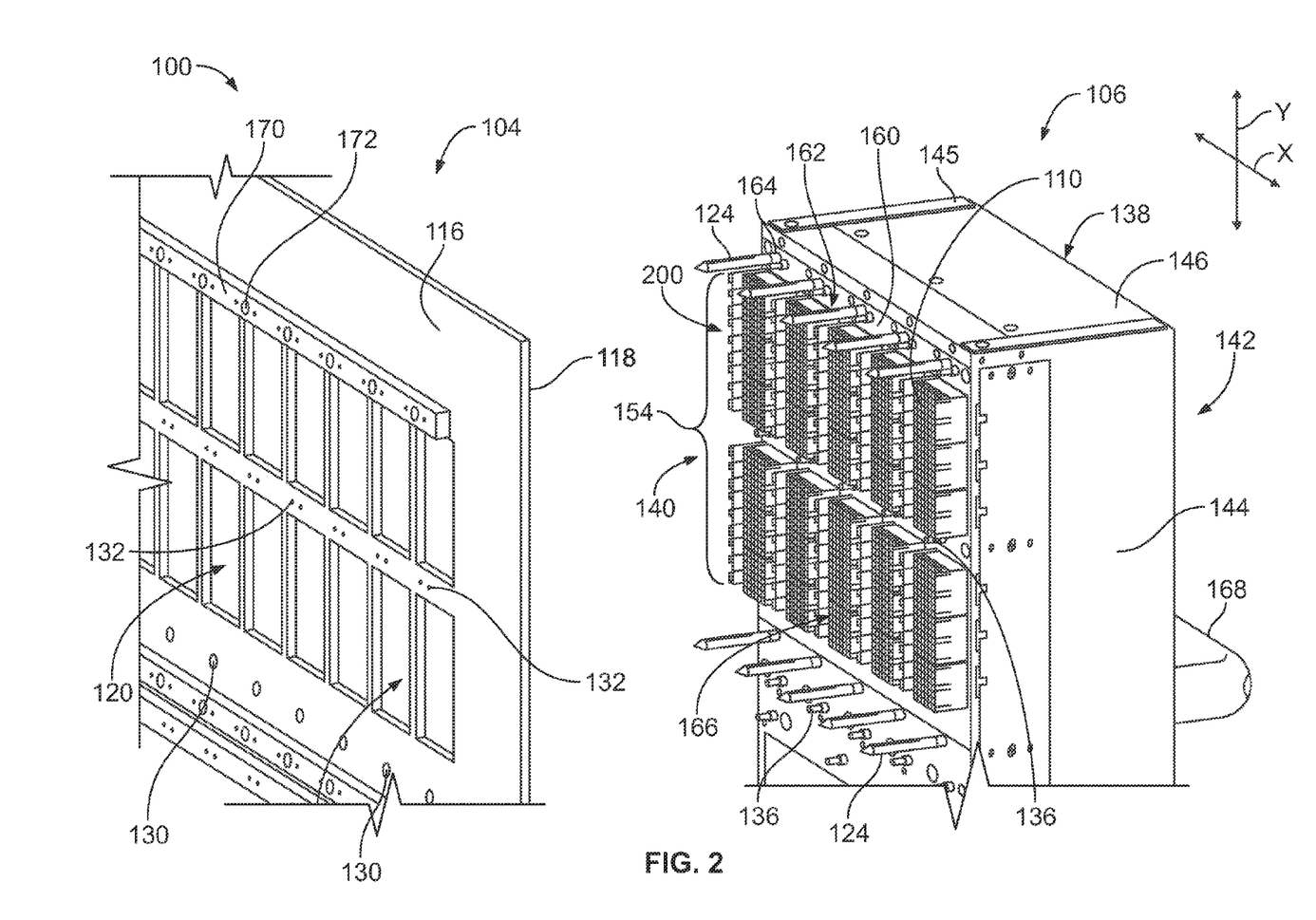
FIG. 2 is a perspective view of a portion of a backplane and a portion of a rack assembly that may be loaded onto the backplane when the backplane communication system of FIG. 1 is assembled.

FIG. 2 is a perspective view of a portion of the backplane 104 and a portion of the rack assembly 106 of the backplane communication system 100. The backplane 104 includes a variety of openings that permit elements of the backplane communication system 100 to pass therethrough. For example, the backplane 104 includes guide holes 130, mounting holes 132, the mating windows 120, and the mating windows 121 (FIG. 1). As described above, the mating windows 120 and the mating windows 121 are configured to receive the electrical connectors 110 and the electrical connectors 111 (FIG. 1), respectively. The guide holes 130 are configured to receive the guide pins 124, and the mounting holes 132 are configured to receive hardware 136, such as jack screws, for securing one or more elements within the backplane communication system 100. In an exemplary embodiment, each of the mating windows 120, 121 is sized and shaped to receive a plurality (or sub-array) of the corresponding electrical connectors. In other embodiments, the mating windows 120, 121 may be sized and shaped to receive only a single electrical connector.

FIG. 2 shows only a single rack assembly 106. However, in an exemplary embodiment, the backplane communication system 100 includes a pair of the rack assemblies 106 that are positioned side-by-side within the chassis cavity 103 (FIG. 1). In other embodiments, however, the backplane communication system 100 may include only one rack assembly 106 or more than two rack assemblies 106. The rack assembly 106 includes an assembly frame 138 having an engagement side 140 and a loading side 142 that face in opposite directions. The rack assembly 106 also includes sidewalls 144, 145, and 146 that extend between the engagement side 140 and the loading side 142. The engagement side 140, the loading side 142, and the sidewalls 144-146 may include walls of sheet metal that are stamped-and-formed to define features for coupling the walls to one another.

The assembly frame 138 is configured to support the electrical connectors 110, 111. For example, the assembly frame 138 may hold the brick units 200 and the brick units 201 (FIG. 1). The brick units 200, 201 may be floatably held by the assembly frame 138 such that the brick units 200, 201 are capable of moving independently with respect to one another in a corresponding confined space. The rack assembly 106 is configured to be positioned adjacent to the backplane 104 such that the engagement side 140 interfaces with the second side 118. When the rack assembly 106 interfaces with the backplane 104, the electrical connectors 110, 111 may extend through the mating windows 120, 121, respectively, and be positioned along the first side 116 for mating with the daughter card assembly 125 (FIG. 1).

Although not shown, the assembly frame 138 defines a cable cavity for routing the communication cables 112 (shown in FIG. 3) between the corresponding electrical connectors 110, 111. As such, the daughter card assemblies 125 (FIG. 1) that engage the electrical connectors 110 may be in communication with the daughter card assemblies 125 that engage the electrical connectors 111 (FIG. 1).

The rack assembly 106 may include a plurality of the brick units 200 and a plurality of the brick units 201 (FIG. 1). Each of the brick units 200 includes a plurality of the electrical connectors 110, and each of the brick units 201 includes a plurality of the electrical connectors 111. As shown in FIG. 2, the rack assembly 106 includes five brick units 200. The electrical connectors 110 for each brick unit 200 may form a sub-array 154. In the illustrated embodiment, the electrical connectors within each sub-array 154 are aligned with one another along one of the lateral axes. For example, the electrical connectors 110 are positioned side-by-side along the Y-axis. Likewise, the electrical connectors 111 of each brick unit 201 may be positioned side-by-side along the X-axis as shown in FIG. 1.

As shown in FIG. 2, the assembly frame 138 includes a cover plate 160 having connector openings 162 and pin openings 164. The cover plate 160 may form part of the engagement side 140 and is positioned to extend across and cover each of the brick units 200. The electrical connectors 110 may extend through the connector openings 162 such that mating ends 166 of the electrical connectors 110 are positioned in front of the cover plate 160. The mating ends 166 are disposed along and face away from the engagement side 140. Also shown, the guide pins 124 may extend through the pin openings 164. The guide pins 124 extend through the cover plate 160 and project away from the engagement side 140. As shown in FIG. 2, the guide pins 124 may have designated locations. For example, the guide pins 124 are substantially evenly distributed along the X-axis in FIG. 3.

Optionally, the assembly frame 138 may include an operator handle 168 that is sized and shaped to be gripped by a technician or other person assembling the backplane communication system 100. The operator handle 168 extends across the loading side 142. In some embodiments, the assembly frame 138 may include more than one of the operator handles 168. The operator handle 168 may enable easier loading of the rack assembly 106. Optionally, the operator handle 168 may be removed once the rack assembly 106 is coupled to the backplane 104.

Also shown in FIG. 2, the backplane 104 may include one or more elongated stiffeners 170 that extend across the backplane 104 along the X-axis. The stiffeners 170 are coupled to the first side 116 in the illustrated embodiment. The stiffeners 170 may include guide holes 172 that align with corresponding guide holes 130 of the backplane 104. The stiffeners 170 may operate to provide structural support to the backplane 104 and/or provide a positive stop for preventing the daughter card assembly 125 (FIG. 1) from advancing further toward the electrical connectors 111.

FIG. 3 is a partially exploded view of the brick unit 200. For illustrative purposes, the orientation of the brick unit 200 has been changed with respect to the orientation of the brick units 200 shown in FIG. 2. The brick unit 200 has a mating face 202, a loading face 204, and opposite unit ends 206, 208. The mating and loading faces 202, 204 face in opposite directions along the Z-axis. The brick unit 200 includes a unit housing 210 that is configured to hold the sub-array 154 of the electrical connectors 110. In the illustrated embodiment, the unit housing 210 includes a pair of opposing housing plates 212, 214 and spacer members 216, 217, 218, and 219 that extend between the housing plates 212, 214. The spacer members 216, 219 may be positioned at the unit ends 206, 208, respectively. The housing plates 212, 214 have forward edges 213, 215. The forward edges 213, 215 extend proximate to the engagement side 140 (FIG. 2) when the assembly frame 138 (FIG. 2) is fully constructed.

The spacer members 216-219 may join the housing plates 212, 214. For example, the housing plates 212, 214 may have openings 220 and the spacer members 216, 219 may have openings 222. When the brick unit 200 is assembled, the openings 220 of the housing plates 212, 214 may align with the openings 222 of the corresponding spacer member and receive, for example, a threaded fastener 224 for securing the housing plates 212, 214 to the spacer members 216-219.

The unit housing 210 may define a chamber 226 in which the electrical connectors 110 are disposed. The unit housing 210 is open-sided along the mating face 202 and along the loading face 204. The electrical connectors 110 are permitted to extend out of the chamber 226 such that the mating ends 166 of the electrical connectors 110 extend beyond forward edges 213, 215 of the housing plates 212, 214, respectively. The communication cables 112 are coupled to the electrical connectors 110 and extend out of the chamber 226 through the loading face 204 and into the cavity (not shown) of the assembly frame 138 (FIG. 2).

In an exemplary embodiment, the electrical connectors 110 are movable or floatable relative to the unit housing 210. For example, in the illustrated embodiment, the electrical connectors 110 may be movable relative to the spacer members 216-219 and the housing plates 212, 214. More specifically, the chamber 226 of the unit housing 210 may be sized and shaped relative to the electrical connectors 110 to permit some movement of the electrical connector 110 along one or more of the X-, Y-, and Z-axes. In the illustrated embodiment, the housing plates 212, 214 include openings 230 that receive a portion of the electrical connectors 110. The openings 230 may be defined by inner surfaces 232 of the housing plates 212, 214. The electrical connectors 110 may include holding features 234 that extend into the openings 230. The holding features 234 are sized relative to the openings 230 so that the electrical connector 110 is permitted to float within the chamber 226. As such, the electrical connectors 110 may move to align with the backplane 104 (FIG. 1) and/or mate with the electrical connectors 128 (FIG. 1) of the daughter card assembly 125 (FIG. 1).

Also shown in FIG. 3, the spacer members 216, 218 have forward-facing edges 238 that are directly coupled to respective guide pins 124A, 124B. For example, each of the spacer members 216, 218 may have an opening 240 for receiving a portion of the respective guide pin 124A, 124B. The guide pins 124A, 124B may form frictional engagements with the respective spacer members 216, 218 such that the guide pins 124A, 124B have fixed positions relative to the unit housing 210 and substantially fixed positions relative to the electrical connectors 110, which may be permitted to float as described above.

The guide pins 124A, 124B are located proximate to the unit ends 206, 208, respectively. Each of the electrical connectors 110 of the sub-array 154 may be located between the guide pins 124A, 124B. In particular embodiments, at least some of the electrical connectors 110 are positioned side-by-side and laterally aligned with one another along the Y-axis. The guide pins 124A, 124B may also be laterally aligned with the electrical connectors 110 along the Y-axis. For example, a plane extending parallel to the Y- and Z-axes may intersect each of the guide pins 124A, 124B and each of the electrical connectors 110.

Optionally, the spacer members 216-219 may have thru-holes 242 that permit the hardware 236, illustrated as jack screws in FIG. 3, to extend through the corresponding spacer member. In some embodiments, the brick unit 200 or the unit housing 210 is permitted to float along one or more of the X-, Y-, and Z-axes relative to the assembly frame 138. For example, the hardware 236 may be sized and shaped relative to the thru-holes 242 to permit the unit housing 210 to move relative to the assembly frame 138. More specifically, the jack screws may have longitudinal portions 237 that extend directly through the thru-holes 242. A gap or space (not shown) may exist between the longitudinal portion 237 and a surface of the spacer member that defines the thru-hole 237. Because of the sizes of the thru-holes 242 and the longitudinal portions 237, the unit housing 210 may be permitted to float relative to the assembly frame 138.

Although not shown in more detail, the brick units 201 (FIG. 1) may include similar or identical elements as the brick unit 200. For example, the brick units 201 may include a unit housing, spacer members, and a plurality of the electrical connectors 111 (FIG. 1). However, in an exemplary embodiment, the brick units 201 do not include guide pins.

Figure 4:
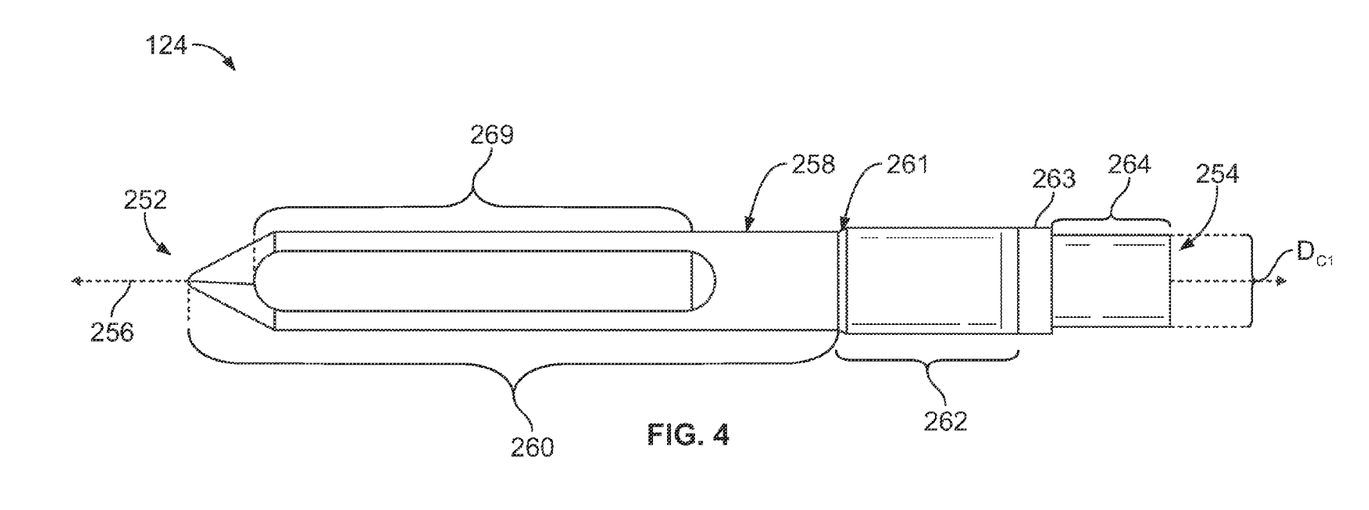
FIG. 4 is a side view of a guide pin that may be used with the backplane communication system of FIG. 1.
Figure 5:
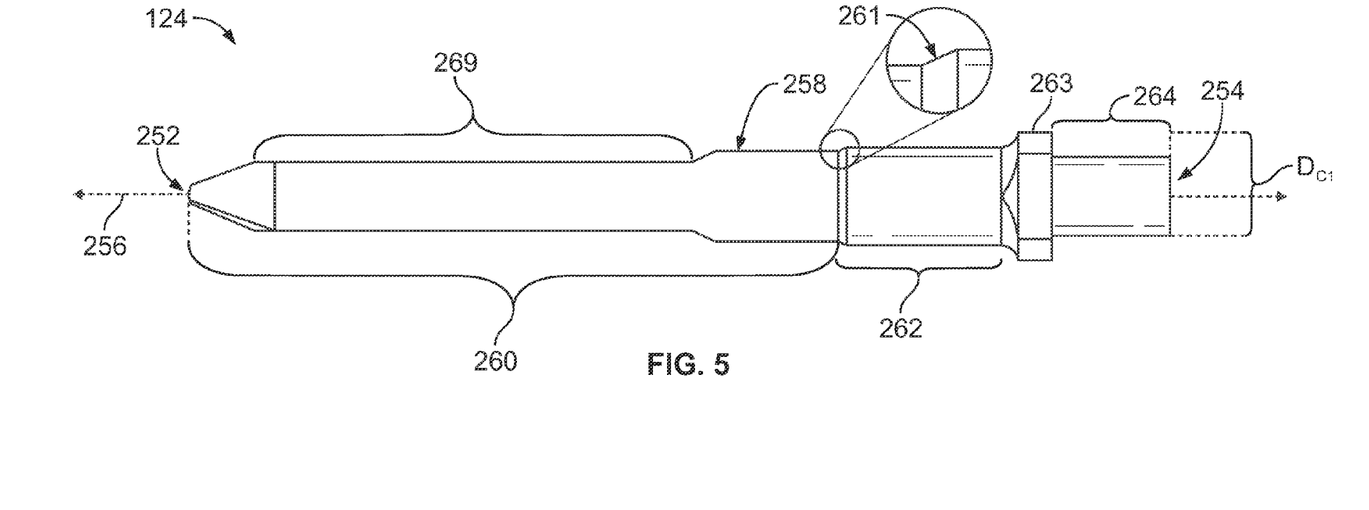
FIG. 5 is another side view of the guide pin that may be used with the backplane communication system of FIG. 1.

FIGS. 4 and 5 provide different side views of the guide pin 124. The guide pin 124 has a distal end 252, a proximal end 254, and a central axis 256 extending therebetween. With respect to the guide pin 124 in FIG. 4, the guide pin 124 in FIG. 5 is rotated +/−90° about the central axis 256. When the guide pins 124 are coupled to the assembly frame 138 (FIG. 2), the proximal ends 254 are directly engaged to the assembly frame 138 and the distal ends 252 are located a distance away from the assembly frame 138. The central axes 256 of the guide pins 124 may extend parallel to the Z-axis (FIG. 1).

The guide pin 124 has an exterior surface 258 that forms a body or shape of the guide pin 124. The exterior surface 258 defines a varying cross-sectional area taken transverse to the central axis 256. For example, the guide pin 124 may have a cross-sectional diameter $D_{C1}$ that is taken or measured transverse to the central axis 256. As used herein, the term "cross-sectional diameter" does not require that the guide pin have a circular cross-sectional area. Instead, the cross-sectional diameter $D_{C1}$ may represent a greatest dimension of the cross-sectional area that is measured through the central axis 256 between opposite points of the exterior surface 258 at a designated location along the central axis 256.

The guide pin 124 may have a series of axial segments 260, 261, 262, 263, and 264 that extend different lengths along the central axis 256. Each of the axial segments 260-264 may have a different cross-sectional area or dimension relative to the adjacent axial segment(s) that immediately precede or follow the corresponding axial segment in the series. In the illustrated embodiment, the series of axial segments 260-264 includes a leading segment 260, a stepped portion or region 261, a trailing segment 262, a flange portion 263, and a frame-engaging segment 264. In some embodiments, the leading segment 260 is configured to be inserted through the guide hole 130 (FIG. 2) before the other axial segments 261-264. The guide pin 124 may be configured such that the distal end 252 clears the guide hole 130 before the stepped portion 261 or the trailing segment 262 advances into the guide hole 130. The trailing segment 262 may be disposed within the guide hole 130 when the rack assembly 106 (FIG. 2) is fully assembled. More specifically, the exterior surface 258 along the trailing segment 262 may directly engage or interface with the backplane 104 (FIG. 1) and reside within the guide hole 130.

In certain embodiments, the leading segment 260 includes a card-engaging portion 269 that is configured to engage the daughter card assembly 125 (FIG. 1) to align the daughter card assembly 125 with respect to the electrical connectors 110 (FIG. 1). The card-engaging portion 269 may be shaped to function as a keying feature such that the guide pin 124 only permits daughter card assemblies 125 that have complementary features to engage the electrical connectors 110. Alternatively or in addition to the above, the card-engaging portion 269 may enable a tool, such as pliers, to more easily grip and rotate the guide pin 124.

Embodiments set forth herein include guide pins that are shaped to facilitate aligning a backplane with respect to a rack assembly during construction of a backplane communication system. During a loading operation in which the backplane is positioned relative to the rack assembly or vice versa, the guide pins may be configured to provide, initially, gross or approximate alignment between the backplane and the rack assembly and, subsequently, a more precise alignment between the backplane and the rack assembly. To this end, cross-sectional areas of the guide pins may be different. For example, the cross-sectional areas or dimensions along the trailing segment 262 and the leading segment 260 of the guide pin 124 may be different. With respect to the illustrated embodiment, the cross-sectional diameter $D_{C1}$ along the trailing segment 262 may be greater than the cross-sectional diameter $D_{C1}$ along the leading segment 260. The stepped portion 261, which is located between the leading and trailing segments 260, 262, may represent an axial segment of the guide pin 124 that abruptly changes the cross-sectional area of the guide pin 124. For example, the cross-sectional diameter $D_{C1}$ along the stepped portion 261 may increase as the guide pin 124 extends through the stepped portion 261 from the leading segment 260 to the trailing segment 262 (or decrease as the guide pin 124 extends from the trailing segment 262 to the leading segment 260). Accordingly, the cross-sectional diameter $D_{C1}$ along the trailing segment 262 is greater than the cross-sectional diameter $D_{C1}$ along the leading segment 260.

The flange portion 263 projects radially away from the central axis 256, and the frame-engaging segment 264 extends between the flange portion 263 and the proximal end 254. The flange portion 263 may be configured to directly engage the corresponding spacer member, such as the spacer member 216 (FIG. 3), when the guide pin 124 is secured to the spacer member. For example, the guide pin 124 may be inserted into the opening 240 (FIG. 3) and then rotated such that the flange portion 263 is rotated into a space (not shown) defined by the spacer member. The flange portion 263 may prevent the guide pin 124 from being inadvertently withdrawn from the spacer member. Alternatively, the guide pin 124 is not rotatable and, instead, the frame-engaging segment 264 forms an interference fit with the spacer member.

Figure 6:
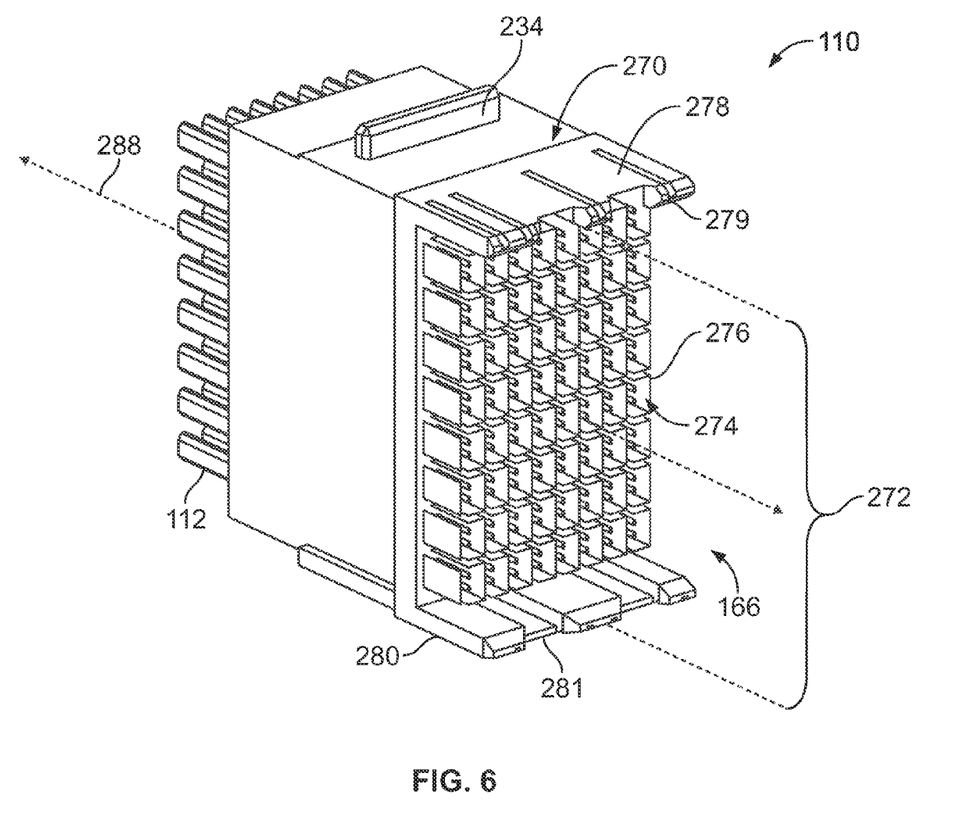
FIG. 6 is an isolated view of an electrical connector that may be used with the backplane communication system of FIG. 1.

FIG. 6 is an isolated perspective view of the electrical connector 110 that shows, in particular, the mating end 166 of the electrical connector 110. Although not shown, the electrical connector 111 (FIG. 1) may have an identical or similar configuration as the electrical connector 110 shown in FIG. 6. The electrical connector 110 includes a shroud housing 270 and a contact array 272 of signal contacts 274 and ground contacts (or shields) 276. The signal and grounds contacts 274, 276 are disposed along the mating end 166 for engaging a corresponding electrical connector 128 (FIG. 1) and are electrically coupled to corresponding cables 112. For example, each of the communication cables 112 may include two signal conductors (not shown) and one or more ground conductors or drain wires (not shown). The signal contacts 274 are electrically coupled to the signal conductors, and the ground contacts 276 are electrically coupled to the ground conductors. In the illustrated embodiment, the signal contacts 274 form signal pairs for high-speed differential signal transmission in which each signal pair is separated from other signal pairs by at least one of the ground contacts 276. The ground contacts 276 may reduce electromagnetic interference experienced by the signal pairs.

Also shown, the shroud housing 270 includes opposite shroud walls 278, 280 that project beyond the contact array 272. The shroud walls 278, 280 extend to respective distal edges 279, 281. The shroud housing 270 also includes the holding feature or features 234. The holding feature 234 may include a structural element that forms a clearance fit within the opening 230. For example, the holding feature 234 may be dimensioned relative to the opening 230 such that the holding feature 234 is permitted to move within the opening 230. More specifically, one or more of the dimensions (e.g., width, length) of the holding feature 234 may be smaller than the corresponding dimensions of the opening 230. In the illustrated embodiment, the holding feature 234 is defined by an external surface 235 that is configured to directly engage the inner surface 232 of the unit housing 210 (FIG. 3) if the electrical connector 110 moves in a designated manner. Accordingly, the electrical connector 110 may be permitted to float within a predetermined space based on the relative dimensions of the opening 230 and the holding feature 234. In the illustrated embodiment, the holding feature 234 is a projection that is configured to directly engage the housing plates 212 (FIG. 3). An additional holding feature (not shown) may engage the housing plate 214 (FIG. 3). In alternative embodiments, the holding features 234 may include surfaces that define recesses that receive portions of the unit housing 210.

In FIG. 6, the electrical connector 110 has a first rotational orientation with respect to a central connector axis 288 that extends substantially parallel to the Z-axis (FIG. 1) when the electrical connector 110 is held by the unit housing 210. As described above, the electrical connector 110 may have an orthogonal relationship with respect to the electrical connector 111. In such embodiments, the electrical connector 111 may have a second rotational orientation that is +/−90° about the connector axis 288 with respect to the first rotational orientation shown in FIG. 6. Electrical connectors 110, 111 that have an orthogonal relationship may be interconnected by the communication cables 112.

Figure 7:
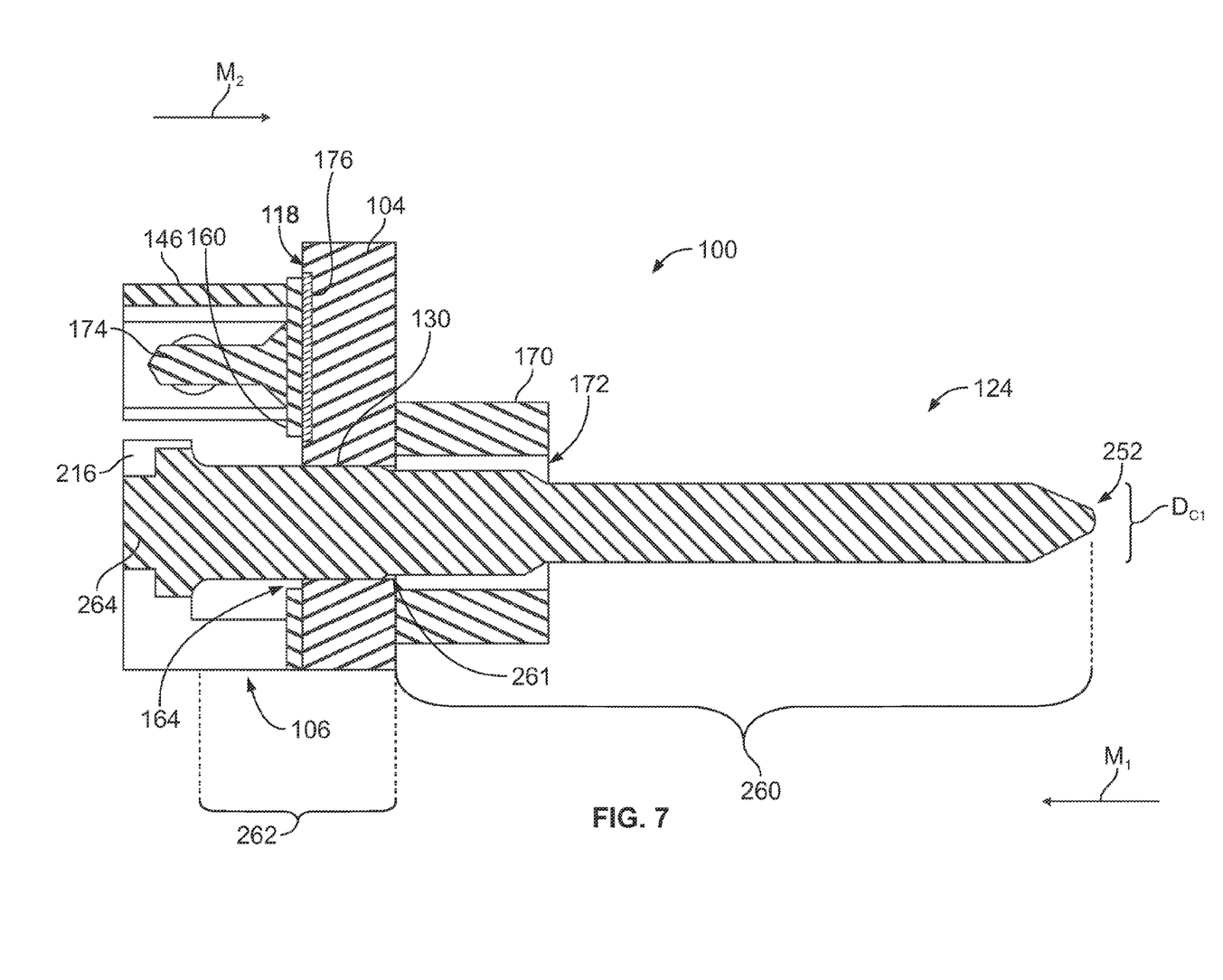
FIG. 7 is an enlarged cross-section of the backplane communication system of FIG. 1.

FIG. 7 is an enlarged cross-section of a portion of the backplane communication system 100. Using a threaded fastener 174, the cover plate 160 has been secured to a portion of the sidewall 146. The backplane 104 has been pressed against and secured to the cover plate 160. To facilitate securing the backplane 104 to the cover plate 160, an adhesive tape 176, such as Kapton®, may be positioned along the cover plate 160 to engage the backplane 104. Also shown in FIG. 7, the frame-engaging portion 264 of the guide pin 124 is coupled to the spacer member 216. The guide pin 124 extends through the pin opening 164 of the cover plate 160, the guide hole 130 of the backplane 104, and a guide hole 172 of the stiffener 170.

The following describes a process of constructing the backplane communication system 100 that includes moving the rack assembly 106 toward the backplane 104 in a mounting direction $M_2$, which may be opposite the mating direction $M_1$. However, it is understood that the backplane communication system 100 may also be constructed by moving the backplane 104 toward the rack assembly 106 in the mating direction $M_1$. In addition, although the following is described and illustrated with respect to only one of the guide pins 124, it is understood that the guide pins 124 may be used collectively to align the backplane 104 and the rack assembly 106 during a loading operation.

The rack assembly 106 may be advanced toward the second side 118 of the backplane 104. When the rack assembly 106 and the backplane 104 are approximately aligned, the distal ends 252 of the guide pins 124 may advance through the corresponding guide holes 130 and the corresponding guide holes 172. As described above, the cross-sectional diameters $D_{C1}$ along the leading segments 260 are smaller than the cross-sectional diameters $D_{C1}$ along the corresponding trailing segments 262. With smaller dimensions along the leading segments 260, it may be easier to initially insert the guide pins 124 through the guide holes 130. If the rack assembly 106 and/or one or more brick units 200 (FIG. 1) is misaligned with respect to the backplane 104, the stepped portions 261 may directly engage the second side 118. Due to a force in the mounting direction $M_2$ and the shape of the stepped portions 261, the rack assembly 106 and/or the brick unit(s) 200 may be re-directed into proper alignment with respect to the backplane 104. More specifically, the rack assembly 106 may be positioned such that the electrical connectors 110, 111 (both shown in FIG. 1) are received through the mating windows 120, 121, respectively, (both shown in FIG. 1) of the backplane 104.

Figure 8:
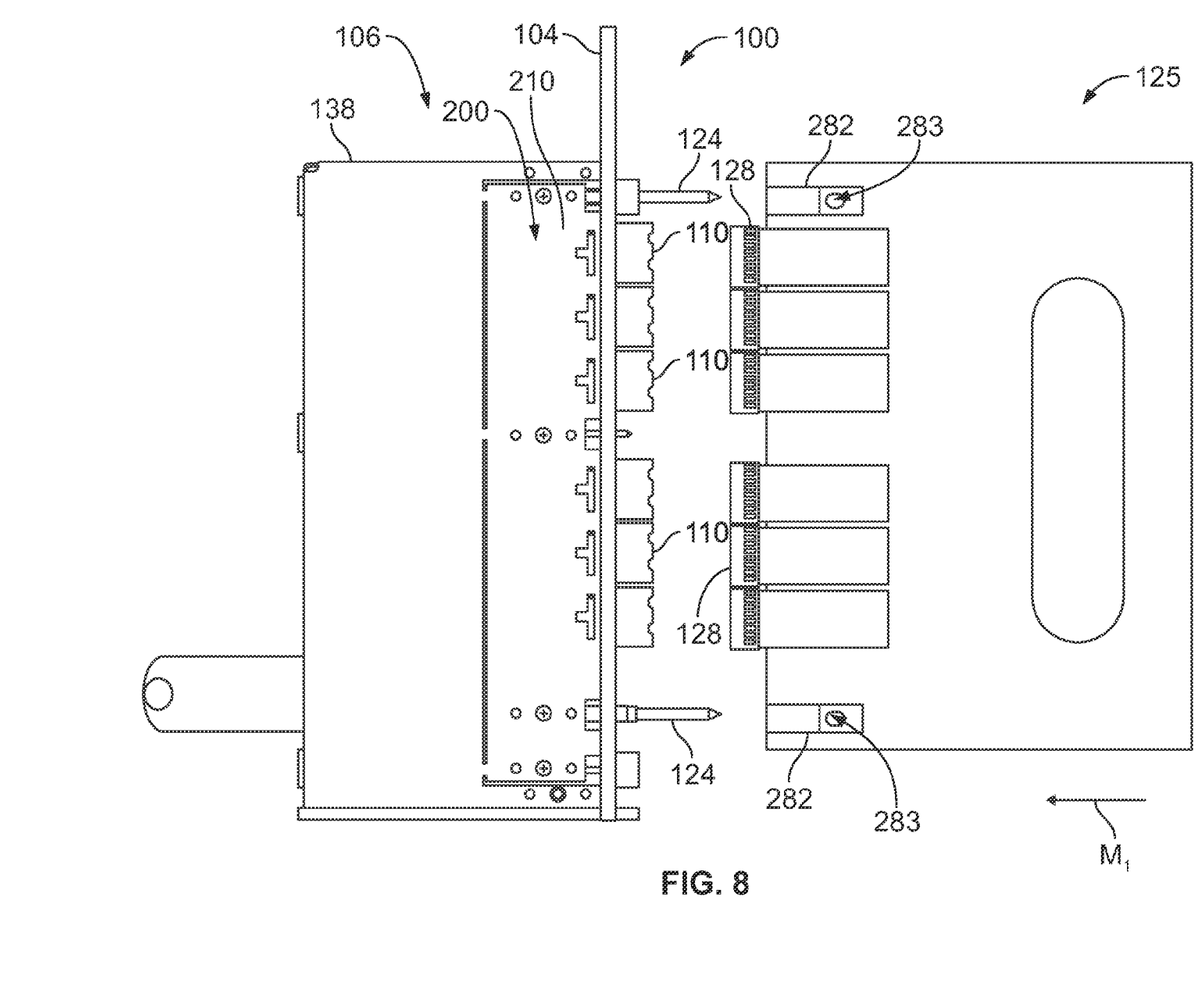
FIG. 8 is a side view of a portion of the backplane communication system of FIG. 1 immediately before mating with a daughter card assembly.

FIG. 8 is a side view of the backplane communication system 100 as the daughter card assembly 125 approaches the backplane communication system 100 in the mating direction $M_1$. FIG. 8 also shows a single brick unit 200 and the electrical connectors 110 that are part of the brick unit 200. In an exemplary embodiment, the guide pins 124 of each brick unit 200 collectively operate with the guide pins 124 of other brick units 200 (not shown in FIG. 8) to align the backplane 104 with respect to the rack assembly 106. After the backplane communication system 100 is assembled, the guide pins 124 of each brick unit 200 may also operate to align a single daughter card assembly 125 with respect to the electrical connectors 110 of the respective brick unit 200.

In the illustrated embodiment, the daughter card assembly 125 includes a pair of alignment receptacles 282 that have cavities 283 for receiving corresponding guide pins 124. During a mating operation in which the daughter card assembly 125 is advanced toward the backplane communication system 100 in the mating direction $M_1$, the unit housing 210 of the brick unit 200 may be permitted to float relative to the assembly frame 138 and/or each of the electrical connectors 110 may be permitted to float relative to the unit housing 210. In some embodiments, if the alignment receptacles 282 engage the guide pins 124 in a misaligned manner, the brick unit 200 may move relative to assembly frame 138 to approximately align the electrical connectors 110 relative to the electrical connectors 128. Accordingly, the guide pins 124 may operate to (a) approximately align the backplane 104 with respect to the rack assembly 106 when the guide pins 124 are initially inserted through the backplane 104; (b) more precisely align the backplane 104 with respect to the rack assembly 106 as the guide pins 124 continue to advance through the backplane 104; and (c) approximately align the corresponding daughter card assembly 125 with respect to the brick unit 200 that has the guide pins 124. Moreover, if one or more of the electrical connectors 128 engage the corresponding electrical connectors 110 in a misaligned manner, the electrical connectors 110 are permitted to individually float with respect to the unit housing 210. In other words, the electrical connectors 110 are permitted to float in different directions and/or different distances with respect to the other electrical connectors 110 of the brick unit 110.

Figure 9:
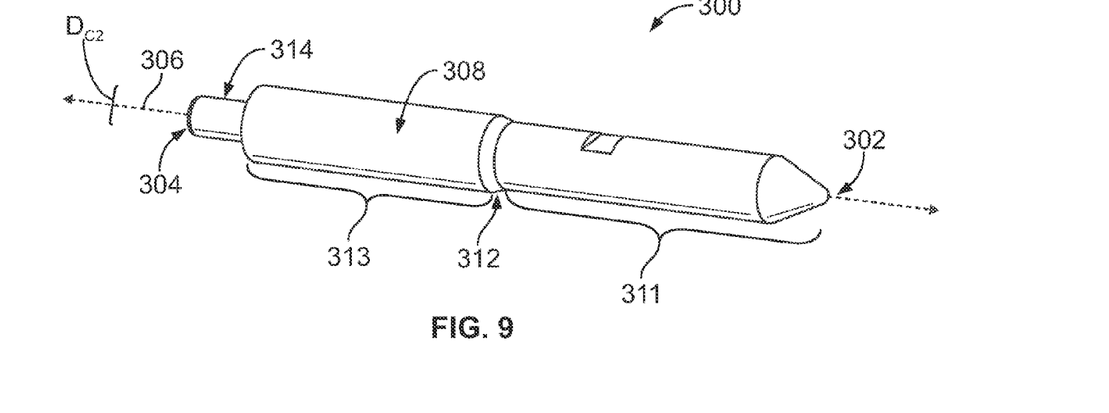
FIG. 9 is a perspective view of a guide pin in accordance with an embodiment.

FIG. 9 is a perspective view of a guide pin 300 in accordance with an embodiment. The guide pin 300 may have similar or identical features as the guide pin 124 (FIG. 1) and may be used with the backplane communication system 100 (FIG. 1). For example, the guide pin 300 includes a distal end 302, a proximal end 304, and a central axis 306 extending therebetween. The guide pin 300 has an exterior surface 308 that forms a body or shape of the guide pin 300. Similar to the guide pin 124, the exterior surface 308 defines a varying cross-sectional area of the guide pin 124 transverse to the central axis 306. The guide pin 300 may have a cross-sectional diameter $D_{C2}$ that is taken or measured transverse to the central axis 306.

The guide pin 300 may have a series of axial segments 311, 312, 313, 314 that extend different lengths along the central axis 306. Each of the axial segments 311-314 may have a different cross-sectional area or dimension relative to the adjacent axial segment(s) that immediately precede or follow the corresponding axial segment in the series. In the illustrated embodiment, the axial segments 311-314 include a leading segment 311, a stepped portion or region 312, a trailing segment 313, and an element-engaging segment 314.

Figure 10:
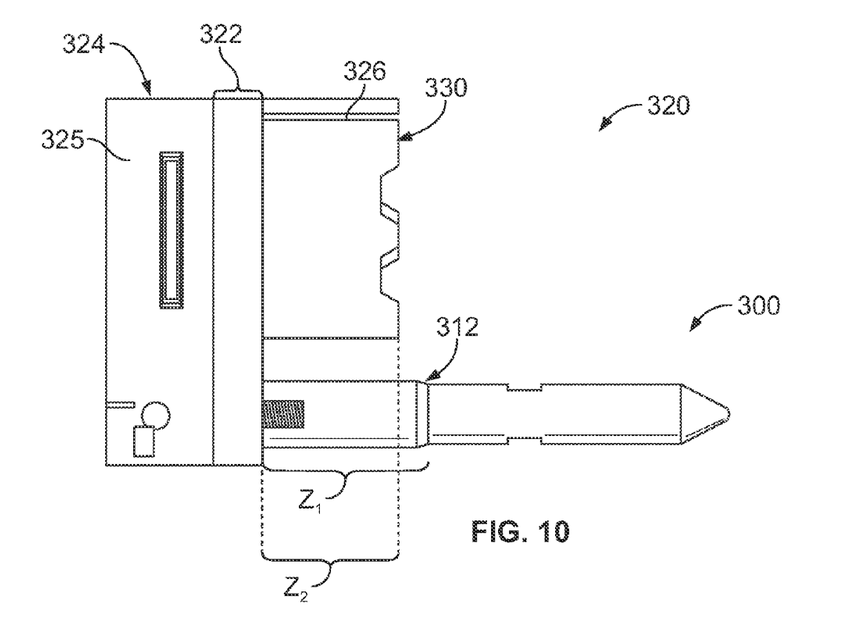
FIG. 10 is a side view of a backplane communication system in accordance with an embodiment that includes the guide pin of FIG. 9.

FIG. 10 is a side view of a backplane communication system 320 in accordance with an embodiment that includes the guide pin 300. As shown, the backplane communication system 320 includes a backplane 322, a brick unit 324 having a unit housing 325, and an electrical connector 326 that is supported by the unit housing 325. The guide pin 300 projects beyond a distal edge 330 of the electrical connector 326. More specifically, the stepped portion 312 is located a first axial distance $Z_1$ away from the backplane 322, and the distal edge 330 of the electrical connector 326 is located a second axial distance $Z_2$ away from the backplane 322. The first axial distance $Z_1$ is greater than the second axial distance $Z_2$. Thus, during a loading operation, the stepped portion 312 may engage the backplane 322 before the distal edges 330 of the electrical connectors 326 begin to extend through mating windows (not shown) of the backplane 322. In such embodiments, the electrical connectors 326 may avoid engaging or snagging the backplane 322 thereby reducing the likelihood of damage to the backplane 322 and/or the electrical connectors 326.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A backplane communication system comprising:
   a backplane having mating windows and guide holes that extend through the backplane;
   a rack assembly having an engagement side and an array of electrical connectors having respective mating ends that are disposed along and face away from the engagement side, the rack assembly including a brick unit having a sub-array of the electrical connectors; and
   a plurality of guide pins each having a distal end, a proximal end, and a central axis extending therebetween, each of the guide pins having a cross-sectional diameter taken transverse to the corresponding central axis, the guide pins being coupled to the rack assembly at the proximal ends and projecting away from the engagement side;
   wherein the backplane interfaces with the engagement side such that the guide pins extend through corresponding guide holes and the electrical connectors are aligned with and extend through the mating windows, each of the guide pins having a leading segment that extends through the corresponding guide hole and a trailing segment that is disposed within the corresponding guide hole, wherein the cross-sectional diameter along the trailing segment is greater than the cross-sectional diameter along the leading segment.

2. The backplane communication system of claim 1, wherein the guide pins include first and second guide pins having a sub-array of the electrical connectors positioned therebetween.

3. The backplane communication system of claim 1, wherein each of the guide pins includes a stepped portion that is located between the leading and trailing segments, the cross-sectional diameter along the stepped portion increasing as the guide pin extends from the leading segment to the trailing segment.

4. The backplane communication system of claim 3, wherein the stepped portion is located a first axial distance away from the backplane and the electrical connectors clear the backplane such that distal edges of the electrical connectors are located a second axial distance away from the backplane, the second axial distance being less than the first axial distance.

5. The backplane communication system of claim 1, wherein a unit housing supports the sub-array of the electrical connectors, at least one of the guide pins having a fixed position with respect to the unit housing.

6. The backplane communication system of claim 5, wherein the rack assembly includes an assembly frame that floatably holds the brick unit, the brick unit configured to move relative to the assembly frame as the at least one guide pin engages a daughter card assembly in a misaligned manner.

7. The backplane communication system of claim 6, wherein the electrical connectors of the sub-array are floatably held by the unit housing, each of the electrical connectors of the sub-array configured to mate with a corresponding connector of the daughter card assembly, wherein each of the electrical connectors of the sub-array is configured to independently move relative to the unit housing as the corresponding connector engages the respective electrical connector in a misaligned manner.

8. The backplane communication system of claim 1, wherein the rack assembly includes first and second brick units that each have a sub-array of the electrical connectors, the electrical connectors of the first brick unit having an orthogonal relationship with respect to the electrical connectors of the second brick unit.

9. The backplane communication system of claim 1, wherein the backplane coincides with a plane defined by first and second lateral axes, the guide pins being substantially evenly distributed across at least one of the first lateral axis or the second lateral axis.

10. The backplane communication system of claim 1, further comprising communication cables that interconnect at least some of the electrical connectors.

11. The backplane communication system of claim 1, further comprising a stiffener that extends along the backplane, the stiffener having guide holes that align with the guide holes of the backplane, at least some of the guide pins extending through the guide holes of the stiffener.

12. A rack assembly of a backplane communication system, the rack assembly comprising:
   an assembly frame having an engagement side configured to interface with a backplane having mating windows;
   a plurality of brick units supported by the assembly frame, each of the brick units including electrical connectors having mating ends for engaging corresponding connectors of a daughter card assembly, the mating ends being disposed along and face away from the engagement side; and a plurality of guide pins that each have a distal end, a proximal end, and a central axis extending therebetween, each of the guide pins having a cross-sectional diameter taken transverse to the corresponding central axis, the guide pins being coupled to the assembly frame at the proximal ends and extending away from the engagement side, wherein each of the guide pins has a leading segment that extends through a guide hole of the backplane and a trailing segment that is disposed within the guide hole when the backplane interfaces with the engagement side, the cross-sectional diameter along the trailing segment being greater than the cross-sectional diameter along the leading segment.

13. The rack assembly of claim 12, wherein the brick units include unit housings and the guide pins include first guide pins and second guide pins, each of the brick units having one of the first guide pins and one of the second guide pins coupled to the unit housing of the brick unit, the electrical connectors of the brick unit being located between the first and second guide pins.

14. The rack assembly of claim 12, wherein at least some of the guide pins includes a stepped portion between the leading and trailing segments, the cross-sectional diameter along the stepped portion increasing as the corresponding guide pin extends from the leading segment to the trailing segment.

15. The rack assembly of claim 12, wherein the brick units include first and second brick units, the electrical connectors of the first brick unit having an orthogonal relationship with respect to the electrical connectors of the second brick unit.

16. The rack assembly of claim 12, wherein the brick units include first and second brick units, the electrical connectors of the first brick unit being stacked side-by-side along a first lateral axis, the electrical connectors of the second brick unit being stacked side-by-side along a second lateral axis that is perpendicular to the first lateral axis.

17. The rack assembly of claim 12, wherein the brick units include first and second brick units and the rack assembly further comprises communication cables, wherein one or more of the electrical connectors of the first brick unit are interconnected to one or more of the electrical connectors of the second brick unit through the communication cables.

18. The rack assembly of claim 17, wherein the rack assembly includes a plurality of the first brick units and a plurality of the second brick units.

19. The rack assembly of claim 12, wherein the assembly frame floatably holds the brick units such that the brick units are capable of independently moving relative to the assembly frame.

20. The rack assembly of claim 12, wherein each of the brick units includes a unit housing that floatably holds the electrical connectors of the corresponding brick unit, wherein each of the electrical connectors of the brick unit is configured to independently move relative to the unit housing as the corresponding connector engages the respective electrical connector in a misaligned manner.

* * * * *